United States Patent
Choy

(10) Patent No.: US 6,575,763 B1
(45) Date of Patent: Jun. 10, 2003

(54) DENSE CONTACT TAIL ALIGNMENT OF CONNECTOR

(75) Inventor: Edmond Choy, Union City, CA (US)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/229,194

(22) Filed: Aug. 26, 2002

(51) Int. Cl.$^7$ ................................................. H01R 9/09
(52) U.S. Cl. ........................................... 439/64; 439/83
(58) Field of Search ........................... 439/64, 83, 326, 439/495, 79

(56) References Cited

U.S. PATENT DOCUMENTS

| | | | | |
|---|---|---|---|---|
| 5,779,494 A | * | 7/1998 | Ito et al. | 439/326 |
| 5,860,825 A | * | 1/1999 | Yodogawa | 439/326 |
| 5,984,708 A | * | 11/1999 | Yu | 439/326 |
| 6,390,842 B1 | * | 5/2002 | Hashimoto | 439/326 |

* cited by examiner

*Primary Examiner*—Lynn D. Feild
*Assistant Examiner*—Phuong Dinh
(74) *Attorney, Agent, or Firm*—Wei Te Chung

(57) ABSTRACT

An electrical connector includes an insulative housing with upper and lower row passageways therein in a zigzag manner along the longitudinal direction of the housing. A plurality of upper and lower row contacts are disposed in the corresponding upper and lower row passageways, respectively. The mounting pads of the upper row contacts extend in one direction and the mounting pads of the lower rows contacts extend in an opposite direction so that the mounting pads of the upper row contacts are able to be respectively aligned with those of the lower row contacts in the front-to-back direction for easy, systematic and regular footprint arrangement on the printed circuit board on which the connector is mounted.

9 Claims, 9 Drawing Sheets

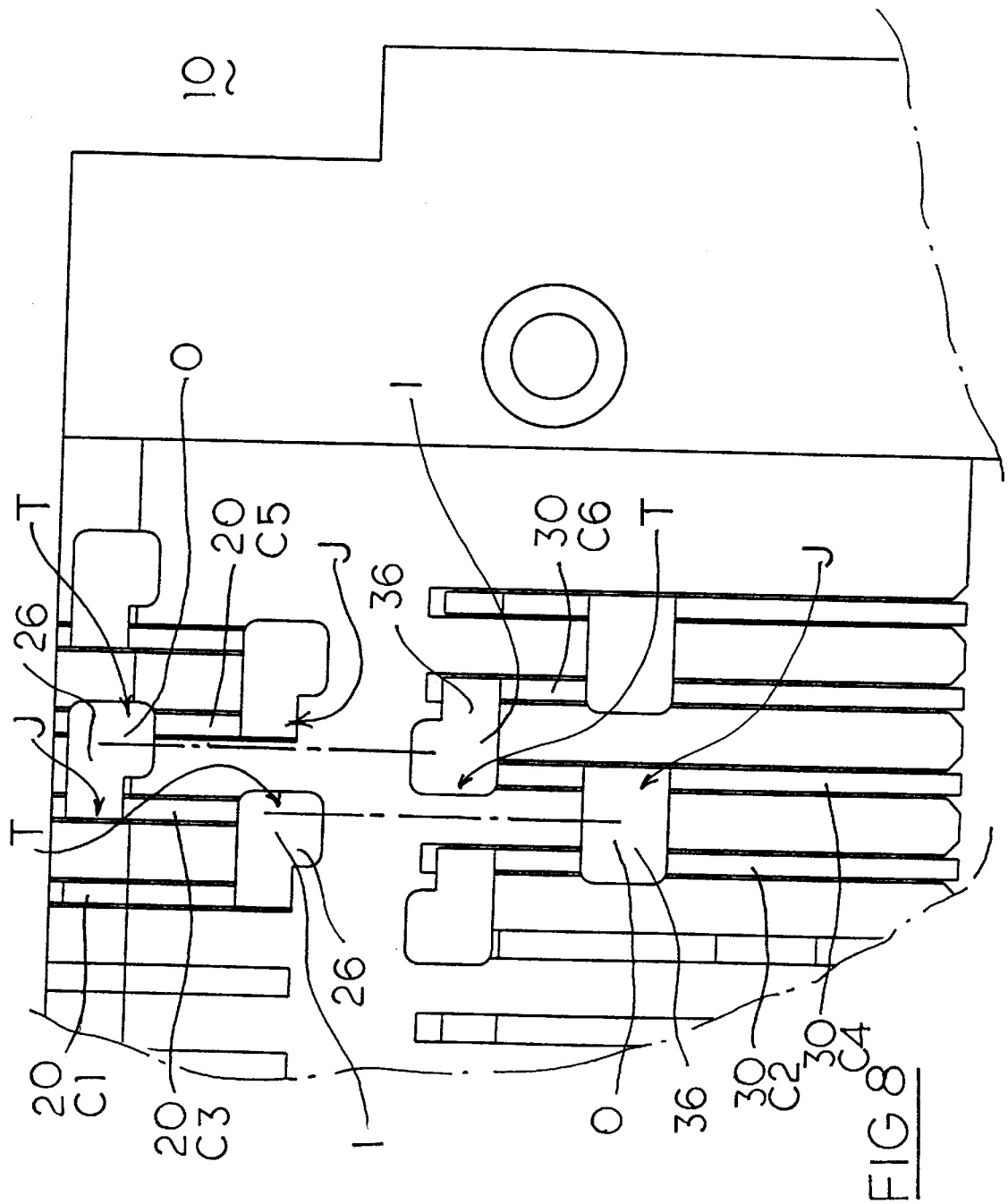

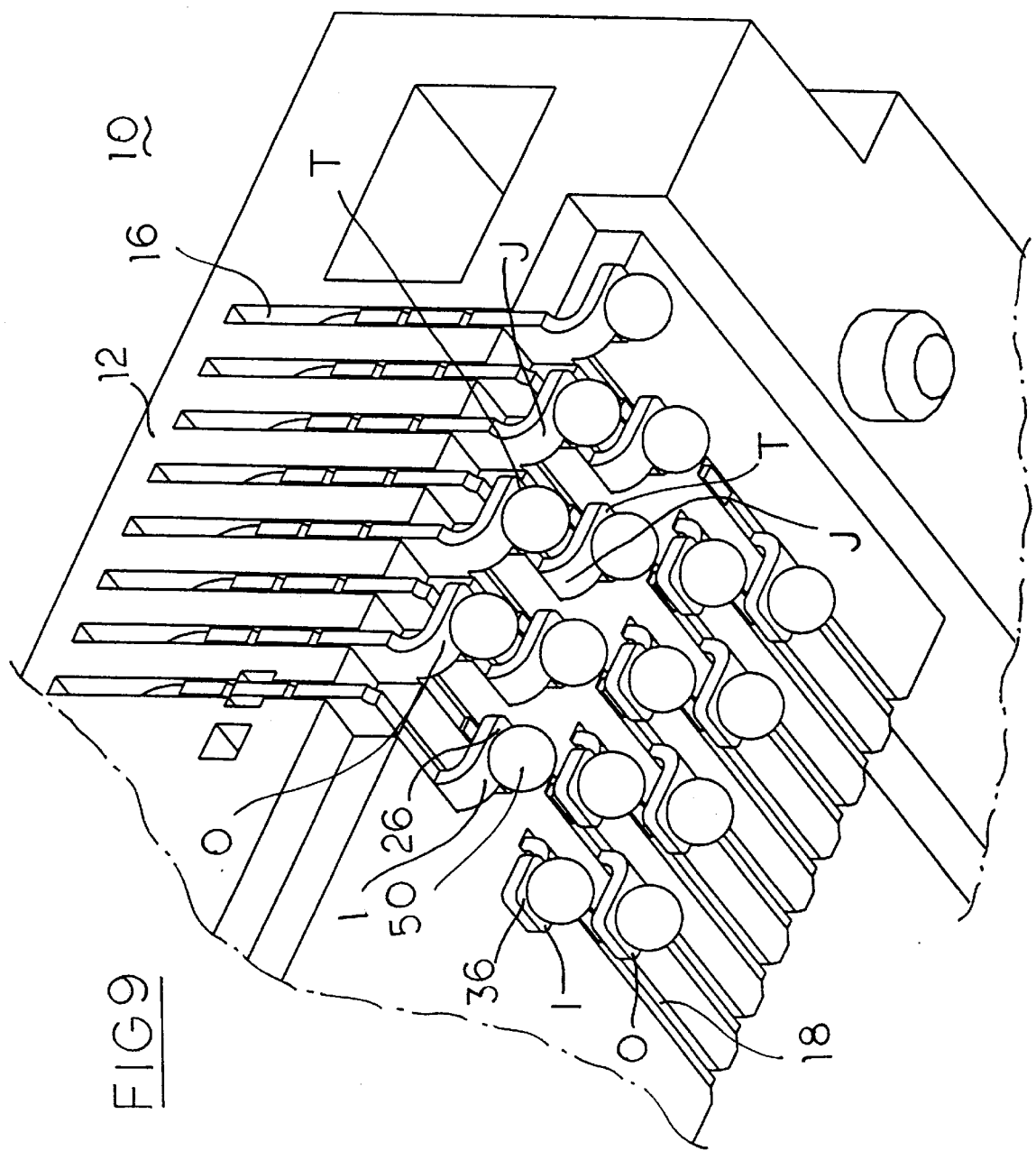

DENSE CONTACT TAIL ALIGNMENT OF CONNECTOR

BACKGROUND OF THE INVENTION

1. Field of The Invention

The invention relates to stacked type connector assembly, and particularly to the connector having the densely arranged solder tails thereof.

2. The Related Art

U.S. Pat. No. 6,126,472 having the same applicant and the same assignee with the invention, discloses two SO DIMM (Small Outline Dual In-line Memory Module) connectors stacked with each other for receiving the two modules, respectively, wherein each of connectors includes upper row and lower row contacts respectively forwardly and rearwardly inserted into and then received in the upper and lower passageways of the corresponding housing. Anyhow, it is noted that in the SO DIMM connector, the upper row contacts and the lower row contacts are staggered with each other, i.e., of a zigzag manner along a longitudinal direction of the connector, as shown in FIG. 6 of U.S. Pat. No. 6,419,513 having the same applicant and the same assignee with the invention, for compliance with the corresponding circuit pads on the lower edge section of the daughter printed circuit board which is received in the central slot of the connector. Additionally, because the adjacent two contacts are spaced from each other with about 0.6 mm, it is required to have tail sections of the adjacent two contacts further staggered with each other along the longitudinal direction of the connector for keeping enough space between every adjacent two solder sections, for avoiding interference between such solder sections while still keeping the whole with the compact region thereof, on the mother printed circuit board on which the connector is mounted. Therefore, there should be four lines of the solder sections applied on the mother board and no any two of such four lines of the solder sections are not aligned with each other in a front-to-back direction.

FIG. 1 shows an approach following this principle, which is disclosed in FIG. 4 of the copending application Ser. No. 10/215,313 filed Aug. 7, 2002, and discloses a design of denser arrangement of the solder tails of the contacts in comparison with the aforementioned U.S. Pat. No. 6,126,472, with the same applicant and the same assignee as the invention, where corresponding to the solder sections/pads on the corresponding mother board, every solder ball 100 on the solder tail of the contact in the connector has its own longitudinal position along the longitudinal direction of the connector and no any (adjacent) two solder balls are aligned with each other in the front-to-back direction. Understandably, there is no problem for its electrical function. Anyhow, sometimes this somewhat odd arrangement may make it little difficult for the designer of the mother board circuit trace layout because he might need to use the irregular routing for each solder sections/pads to escape from the adjacent solder section/pads for no interference therebetween. This makes it difficult and complex in the circuit trace layout design. Accordingly, it is desired to provide a new tail arrangement of the contacts of the SO DIMM connector, which allows an easy and systematic/scientific arrangement of the corresponding solder sections/pads on the mother board.

SUMMARY OF THE INVENTION

According to an aspect of the invention, a SO DIMM connector includes an insulative housing defining a central slot with upper and lower rows of passageways by two sides thereof. The upper passageways and the lower passageways are staggered with each other along a longitudinal direction of the housing. Upper and lower rows of contacts are respectively received in the corresponding upper and lower passageways, respectively. Each contact has a contact portion extending into the central slot for engagement with the corresponding circuit pad on a lower edge portion of the daughter board received within the central slot, a retention portion for retaining the contact in the housing, and a mounting pad, i.e., the tail portion, bent at a right angle relative to the main body of the contact. The mounting pads of the two adjacent two contacts in the same upper or lower row are staggered with each other along the longitudinal direction of the housing while the mounting pads of the upper row contacts are bent at a right angle in a first direction which is opposite to a second direction along which the mounting pads of the lower row contacts are bent at a right angle. Therefore, there are four lines of the mounting pads of the upper and lower contacts along the longitudinal direction wherein the mounting pad of one contact in one row is substantially aligned with the corresponding mounting pad of one contact in another row in a front-to-back direction so that the corresponding solder pads, i.e., solder section, on the mother board can be arranged in a relatively neat manner for allowing easy routing of the circuit traces thereof.

Another aspect of the invention includes the installation sequence of the contacts, wherein the upper row contacts are forwardly inserted into the housing from the rear face of the housing and the lower contacts are rearwardly inserted into the housing from the front face of the housing under a condition that the contacts with the inner mounting pads of each row contacts are inserted into the housing prior to those with the outer mounting pads so as to avoid obstruction of installation of the contacts if in a reverse order. This requirement results from the mounting pad of each contact being overlapped with those of two opposite neighboring contacts in the front-to-back direction.

Another feature of the invention provides the mounting pads with the solder balls thereon as disclosed in the aforementioned copending application Ser. No. 10/215,313, wherein the application of the solder ball can be referred to U.S. Pat. No. 6,220,884 having the same assignee with in this invention.

BRIEF DESCRIPTION OF THE DRAWINGS

FIG. 8 is an enlarged partial bottom view of the connector of FIG. 2 showing the relationship of the mounting pads of the contact with regard to the adjacent contacts.

FIG. 9 is an enlarged partial rear perspective view of the connector of FIG. 2 with the solder balls thereon.

DETAILED DESCRIPTION OF THE PREFERRED EMBODIMENTS

Figure 1:
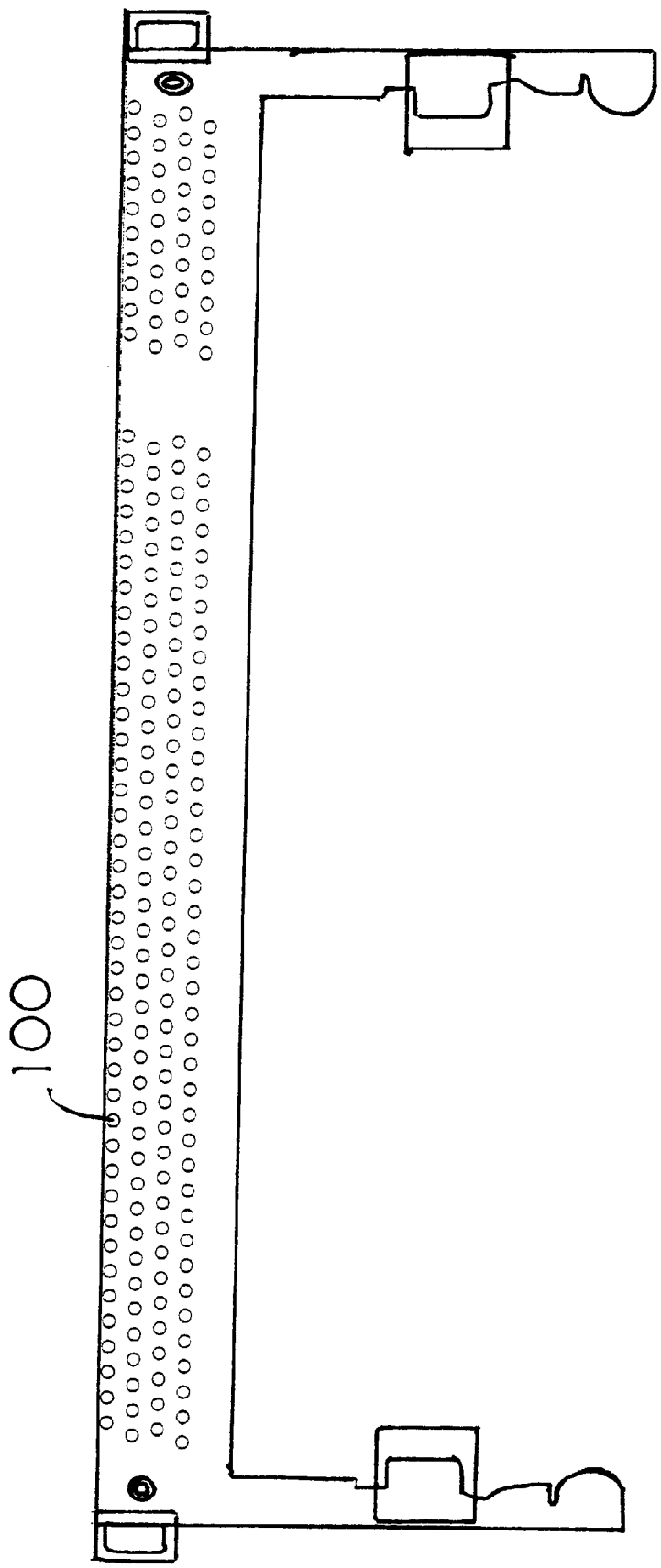
FIG. 1 is a descriptive sketch for illustrating the unimproved contact arrangement used in the earlier copending application Ser. No. 10/215,313.
Figure 2:
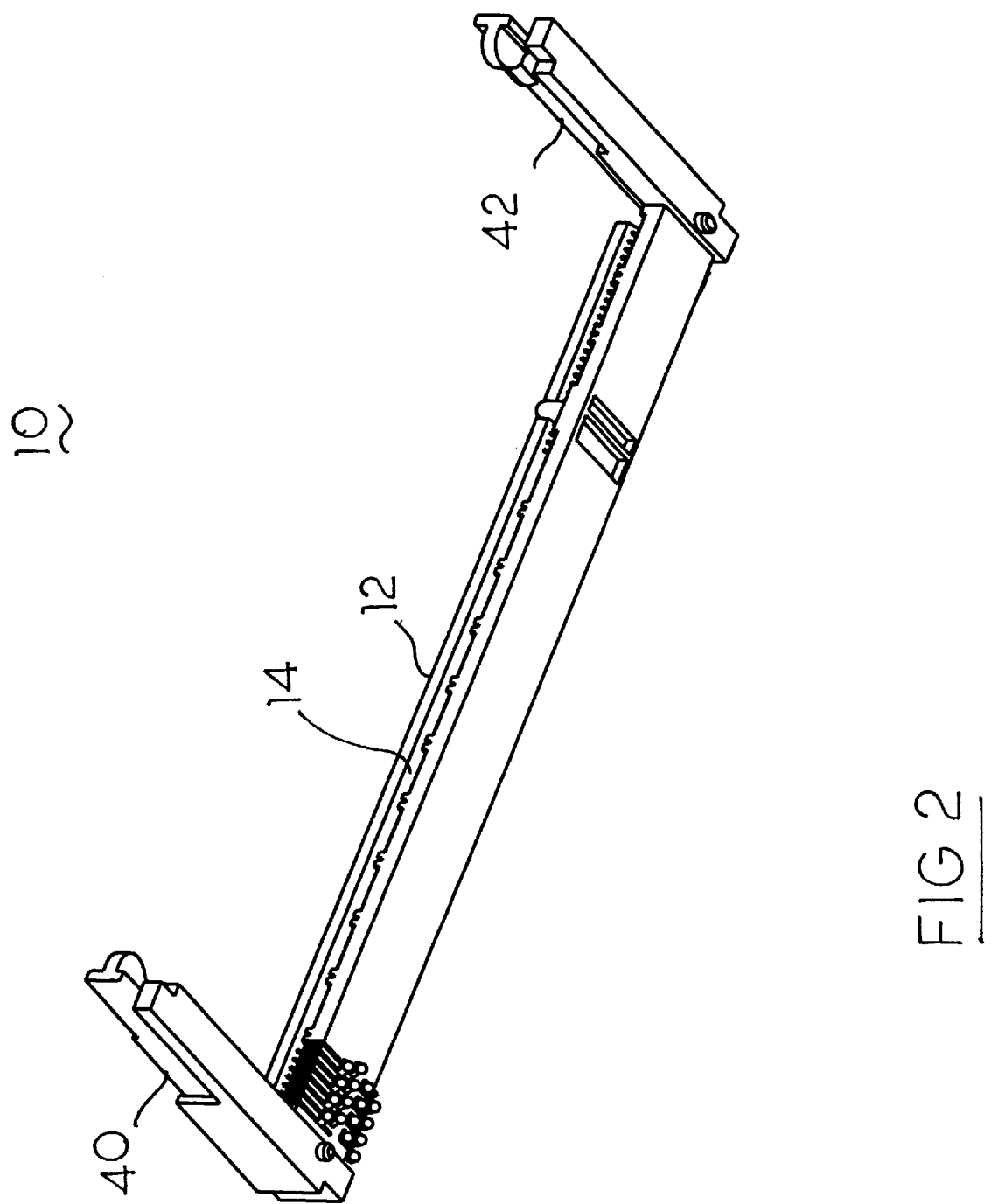
FIG. 2 is a front perspective view of a present preferred embodiment of the SO DIMM connector showing some passageways and some contacts and associated solder balls thereof while without showing the metal support piece beside the plastic latch.
Figure 3:
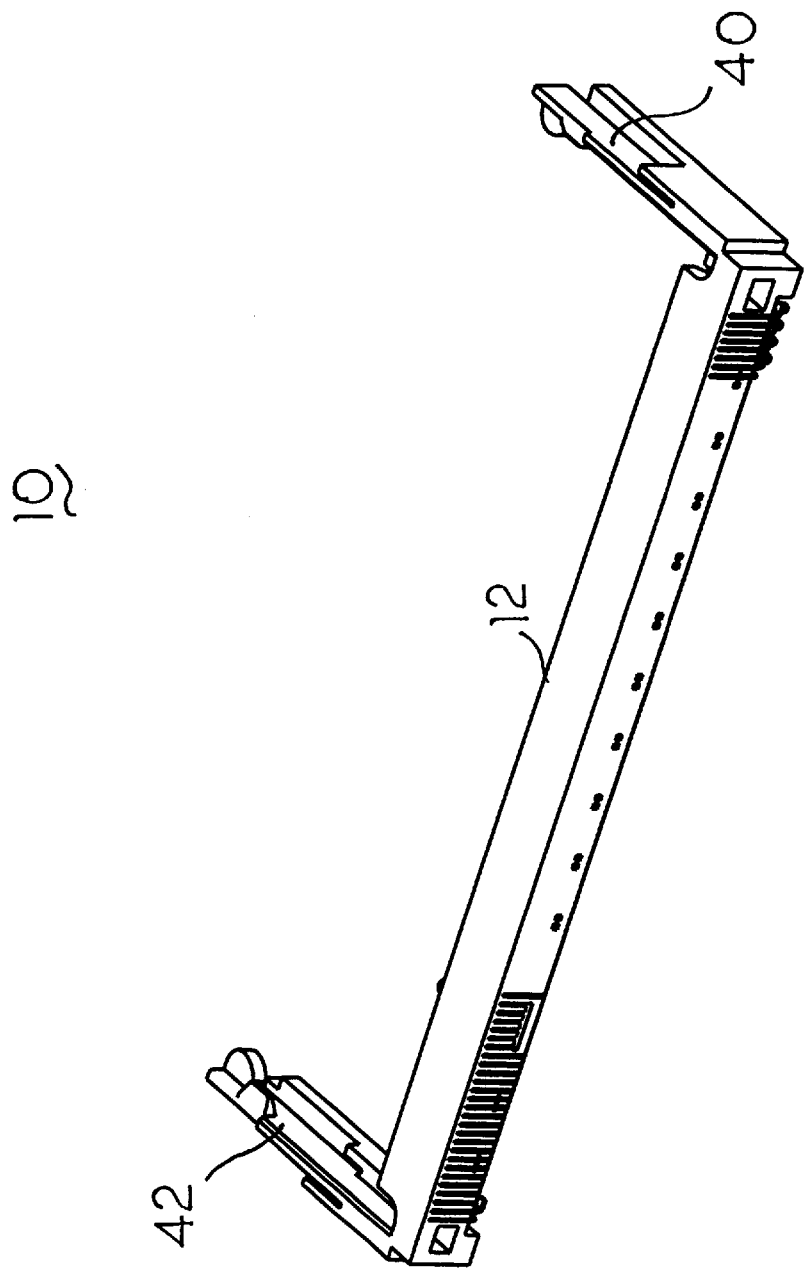
FIG. 3 is a rear perspective view of the connector of FIG. 2.
Figure 4:
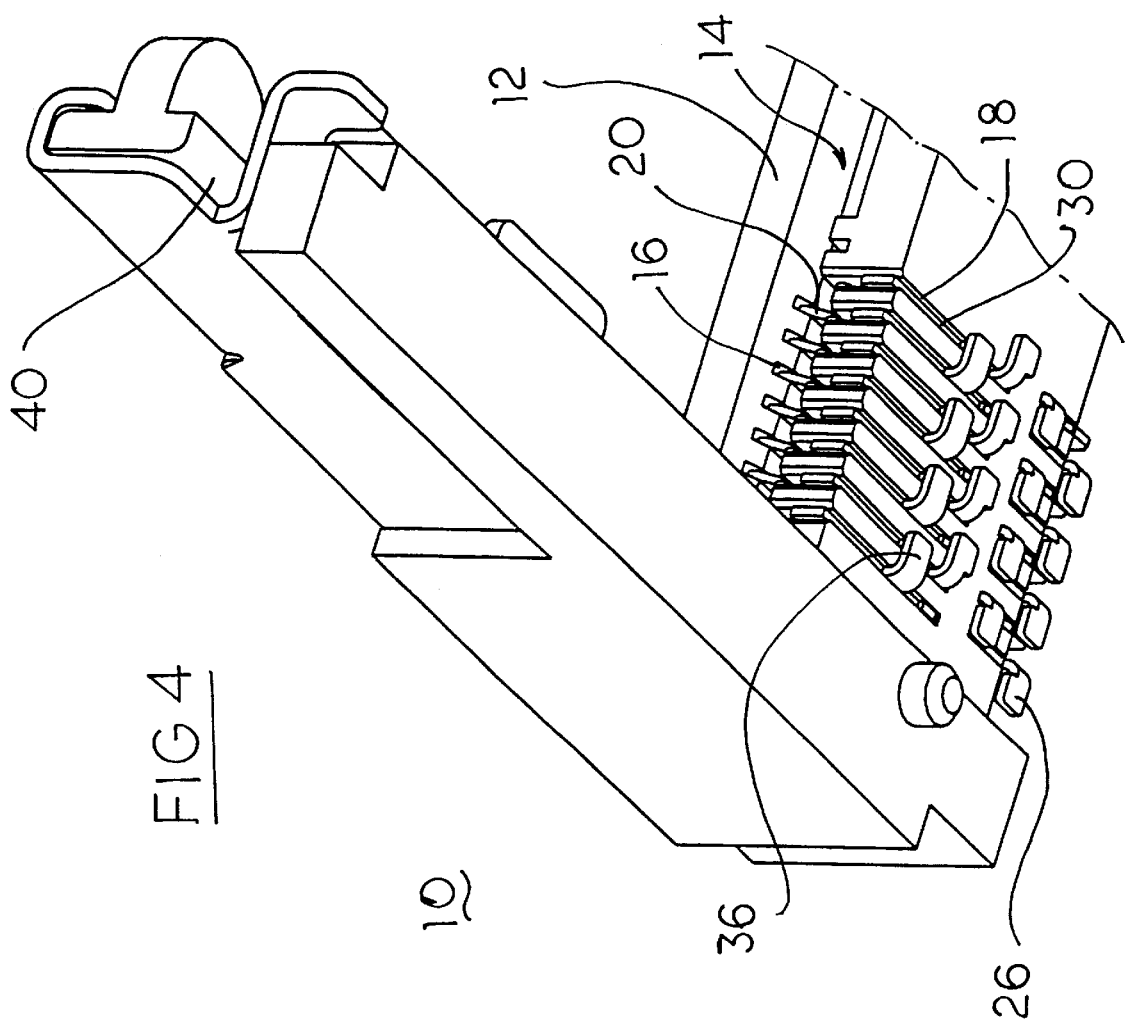
FIG. 4 is an enlarged partial front perspective view of the connector of FIG. 2 without showing the solder balls thereof.
Figure 5:
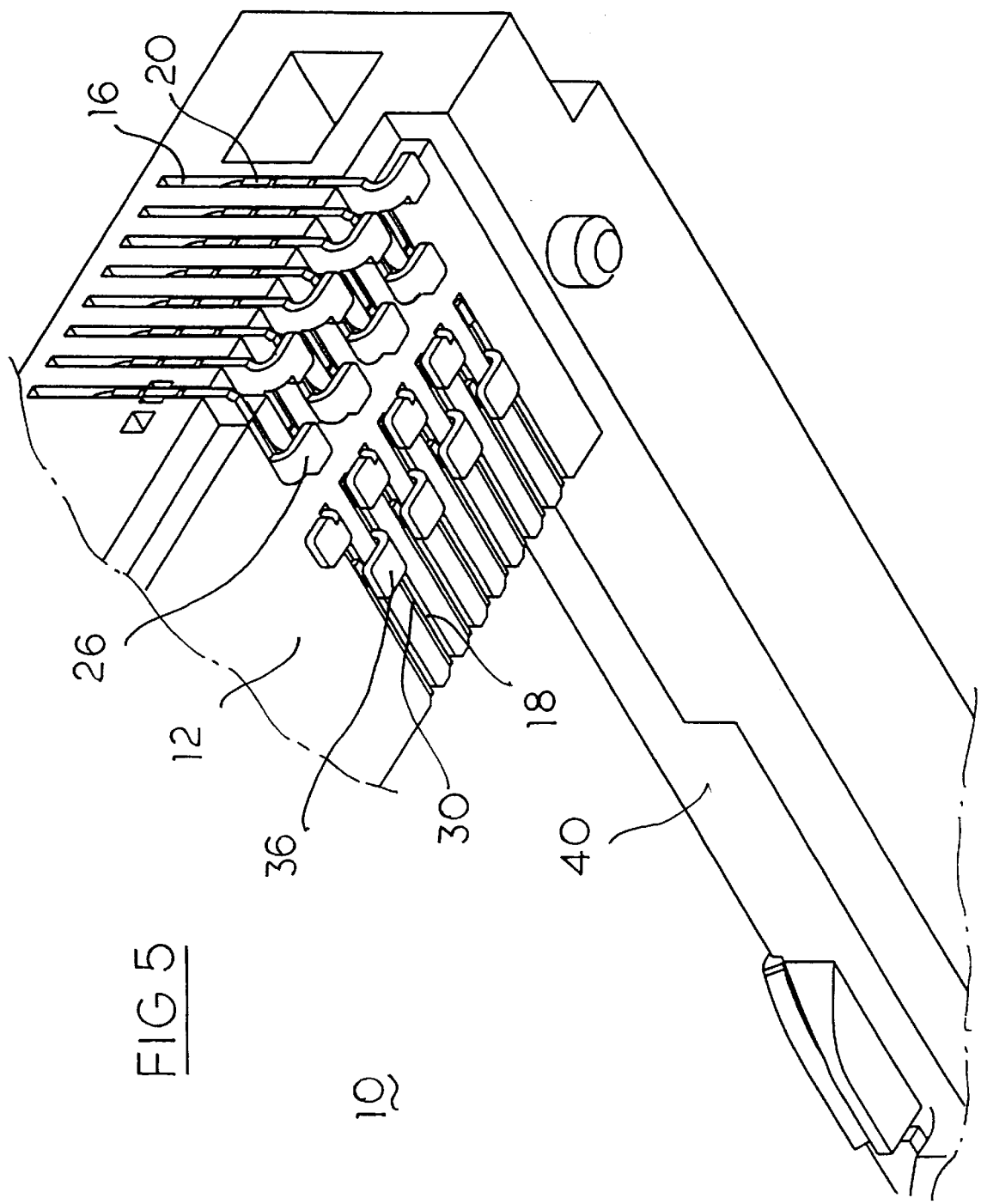
FIG. 5 is an enlarged partial rear perspective view of the connector of FIG. 2 without showing the solder balls thereof.

References will now be in detail to the preferred embodiments of the invention. While the present invention has been described in with reference to the specific embodiments, the description is illustrative of the invention and is not to be construed as limiting the invention. Various modifications to the present invention can be made to the preferred embodiments by those skilled in the art without departing from the true spirit and scope of the invention as defined by appended claims.

It will be noted here that for a better understanding, most of like components are designated by like reference numerals throughout the various figures in the embodiments. Attention is directed to FIGS. 2–9 wherein the SO DIMM connector 10 adapted to be mounted on the mother board (not shown), includes an insulative housing 12 defining a longitudinal direction thereof and a central slot 14 along the longitudinal direction with upper and lower (row) passageways 16, 18 by two sides thereof. A plurality of upper (row) contacts 20 and a plurality of lower (row) contacts 30 are respectively disposed in the corresponding upper passageways 16 and lower passageways 18. A pair of latches 40, 42 extend forwardly from two opposite ends of the housing 12. The operation of latches 40, 42 of the connector with the corresponding daughter board (not shown) inserted into the central slot 14, is a common knowledge, and thus will not be described further in details.

Figure 7:
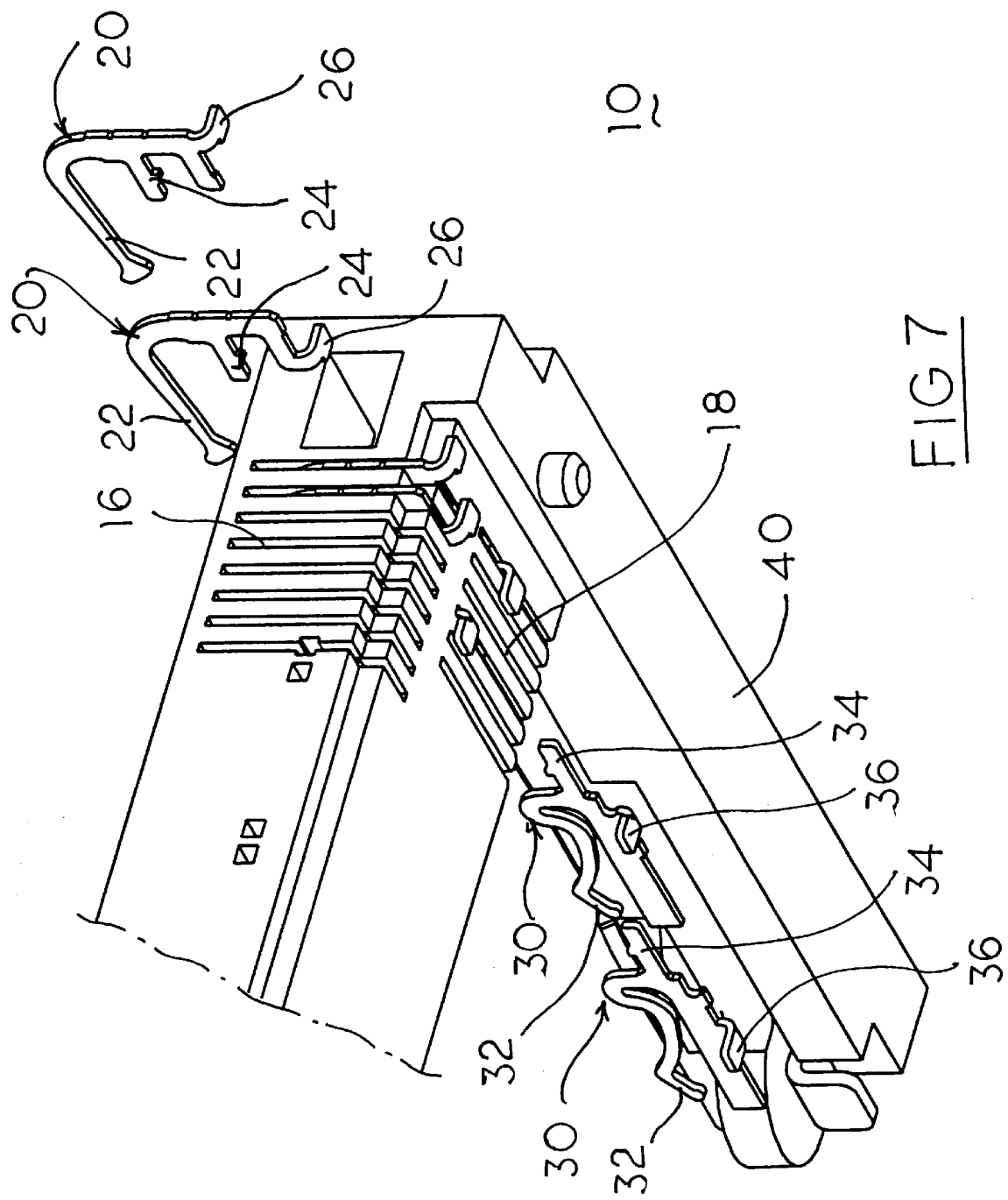
FIG. 7 is an enlarged partial rear perspective view of the connector of FIG. 2 without showing the solder balls thereof, wherein some contacts are removed from and exposed outside the housing.

Further referring to FIG. 7, each upper(lower) contact 20(30) includes a main body defining thereof a main plane, in compliance with the corresponding passageway 16(18), with a contact portion 22(32) extending into the central slot 14, a retention portion 24(34) retaining the contact 20(30) in position in the housing 12, and a mounting pad 26(36) extending horizontally around a bottom portion thereof. In this embodiment, a solder ball 50 is adhered to the undersurface of the mounting pad 26(36) for bonding on the mother board, i.e., the solder ball surface mounting instead of the traditional surface mounting.

It is noted that as mentioned before, the upper passageways 16 and the lower passageways 18 are staggered with each other along the longitudinal direction of the housing 12, (clearly shown in FIGS. 8 and 9), for compliance with the electrical pads on the lower edge portion of the daughter board. Furthermore, the two mounting pads 26 of the adjacent two contacts 20 are also staggered with each other along the longitudinal direction of the housing 12 so as not to be too close with each other for better/easy arrangement in either the connector 10 itself or the mother board. The same pattern is also applied to the mounting pads 36 of the lower contacts 30. In other words, the mounting pads 26(36) are categorized as some outer ones (labeled as O) and some inner ones (labeled as I) based on their positions relative to the center region of these four lines mounting pads 26(36).

In this embodiment, to achieve an even, systematic/scientific arrangement of the mounting pads 26(36) and the corresponding solder pads on the mother board (not shown), the mounting pads 26 are bent and extend toward the latch 40 in a first lengthwise direction while the mounting pads 36 are bent and extend toward the latch 42 in a second lengthwise direction opposite to said first direction. Under this situation, the mounting pad 26 of one upper contact 20 can be aligned with the mounting pad 36 of one lower contact 30 in the front-to-back direction of the housing 12.

Figure 6:
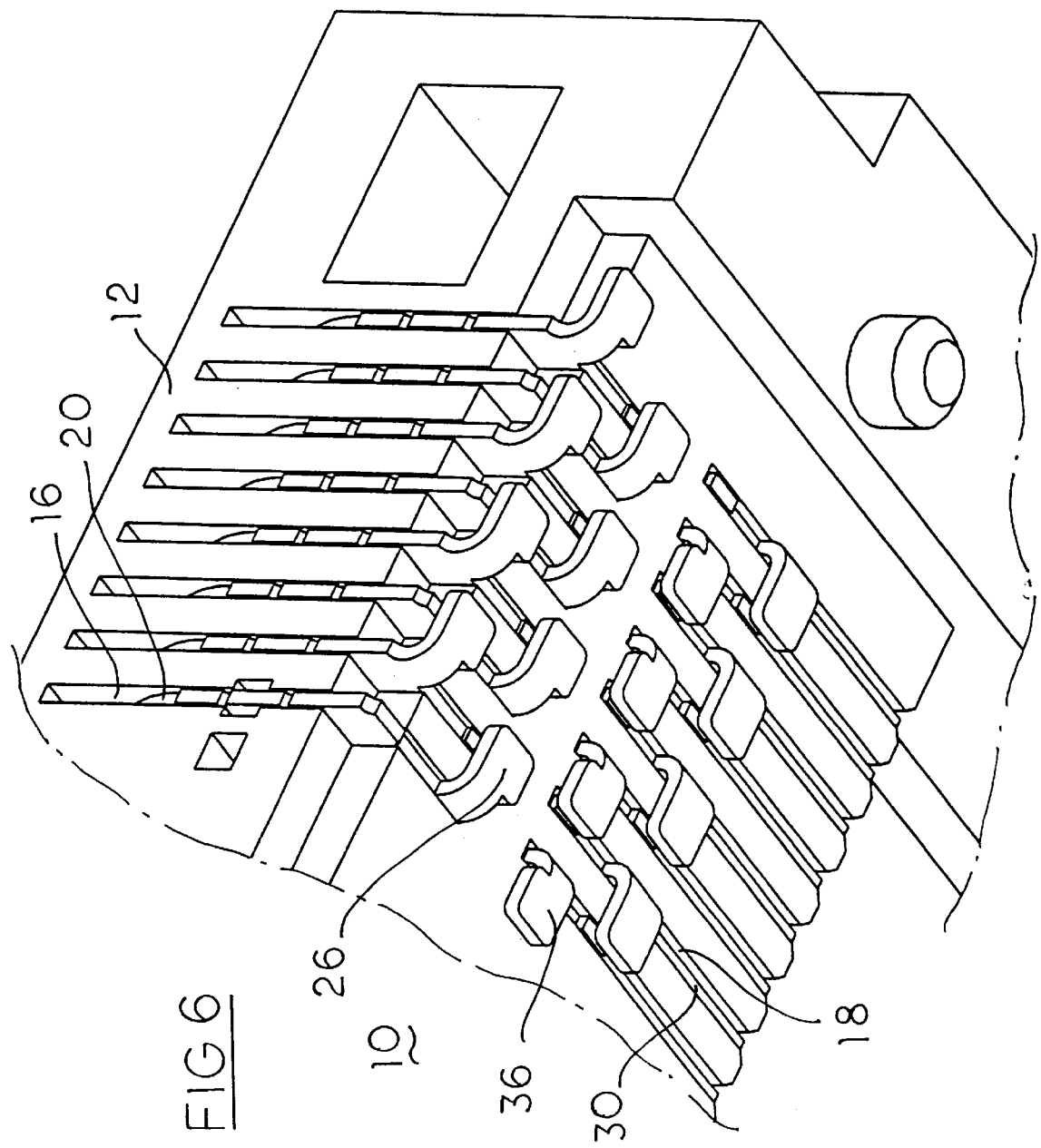
FIG. 6 is an enlarged partial rear perspective view of the connector of FIG. 5.

In a detailed illustration, especially as shown in FIGS. 6, 8 and 9, the inner mounting pad 26 of one specific upper contact 20 (also labeled as C1) is aligned in a front-to-back direction with the outer solder mounting pad 36 of one lower contact 30 (also labeled as C4) which neighbors with another pair of upper and lower contacts 20, 30 (also labeled as C3 and C2) therebetween. Similarly, the outer mounting pad 26 of the upper contact 20 (also labeled as C3) is aligned with the inner mounting pad 36 of one lower contact 30 (also labeled as C6) which neighbors with another pair of upper and lower contacts 20, 30 (also labeled as C5 and C4) therebetween. In other words, for every four sequentially neighboring contacts 20, 30 regardless whether they are upper contacts 20 or lower contacts 30, the mounting pad of the first contact is aligned, in the front-to-back direction, with the mounting pad of the fourth contact with the second and third contacts therebetween if both the upper and lower contacts 20, 30 are sequentially counted along the longitudinal direction of the housing 12.

It is noted that the upper contacts 20 are respectively forwardly inserted into the corresponding upper passageways 16 from a rear face of the housing 12, while the lower contacts 30 are rearwardly respectively inserted into the corresponding lower passageways 18 from a front face of the housing 12. It is also noted that regardless of whether they are upper contacts 20 or lower contacts 30, the contacts having the inner mounting pads are required to be assembled into the housing 12 before those having the outer mounting pads. It is because for each individual contact in one row, its own mounting pad extends along the designated direction and substantially terminates under the adjacent contact in the same row in the vertical direction. In other words, referring to FIGS. 8 and 9 the tip T of the mounting pad is overlapped, along the front-to-back direction, with the joint portion J of the main body and the mounting pad of the such adjacent contact right beside the subject contact in the pad extension direction. Similarly, the tip T of the other adjacent contact on the other side opposite to the extension direction, is also overlapped, in the front-to-back direction, with the joint portion J of the main body and the mounting pad of the subject contact. Thus, for the contacts in the same row, either the upper (row) contacts 20 or the lower (row) contacts 30, the contacts having the inner mounting pads should be first installed into the housing 12 prior to those with the outer mounting pads.

It is contemplated that the conventional connectors use either through hole or traditional surface mounting technology, and thus requires less area of the mounting pad/tail. The invention is intended to be applied to the so-called solder ball surface mounting where a solder ball is required to be adhered to the undersurface of the mounting pad for bonding on the mother board. Under this situation, the mounting portion of the contact is required to provide the sufficient area, in comparison with the traditional surface mounting, for holding the solder ball thereon, and this is the reason why the mounting portion of the contacts used in the traditional SO DIMM connector are generally located on the same plane with the main body of the contacts themselves and having less soldering/mounting area, while the instant invention requires provision of additional mounting pad extending laterally relative to the plane defined by the main body of the contact to provide the larger mounting area for installation of the corresponding solder ball thereon. Understandably, because the adjacent contacts in the same row are so close to one another, i.e., the fine pitch design, the lateral extending mounting pad can not help but invade the adjacent contact region in both the vertical direction and the front-to-back direction. This is the reason why the contacts with the inner mounting pads should be assembled to the housing 12 first relative to those with the outer mounting pads, as mentioned in the previous paragraph.

It is appreciated that as mentioned in the previous paragraph, one feature of the invention is to intentionally deflect the mounting portion of a traditional fine pitch blanking/forming type contact, which is essentially located or extends on the plane defined by its main body, for providing a horizontal mounting pad extending along the lengthwise direction of the housing and perpendicular to that defined plane to install a solder ball thereon, wherein the method of arranging the extension directions of the mounting pads is not limited with what is disclosed in the current embodiment, e.g., the mounting pads of the contacts in the same row being bent in the same direction, as long as the mounting pads of the mutually adjacent contacts can be generally aligned with one another in the front-to-back direction for being more systematic, regular and friendly to the designers or operators.

While the present invention has been described with reference to specific embodiments, the description is illustrative of the invention and is not to be construed as limiting the invention. Various modifications to the present invention can be made to the preferred embodiments by those skilled in the art without departing from the true spirit and scope of the invention as defined by the appended claims. For example, the invention can be also applied to the stacked type connector assembly disclosed in the aforementioned copending application Ser. No. 10/215,313, or applied to other type connector not belong to the so-called card edge connectors.

Therefore, person of ordinary skill in this field are to understand that all such equivalent structures are to be included in the scope of the following claims.

I claim:

1. An electrical connector for mounting to a printed circuit board, comprising:

an insulative housing defining a central slot, for receiving a module therein, with a plurality of first row and second row passageways by two sides thereof, said first row and second row passageways being staggered with each other along a longitudinal direction of the housing; and a plurality of first row and second row contacts respectively disposed in the corresponding first row and second row passageways, each of said first and second row contacts including a contact portion extending into the central slot for electrically and mechanically engagement with the module, and a horizontally extending mounting portion, the mounting portion of the contact being staggered with that of the adjacent contact in the same row along the longitudinal direction; wherein the mounting pads of the first row contacts all extend in a first direction along said longitudinal direction and those of the second row contacts all extend in a second direction opposite to said first direction, wherein the mounting pads of each of the first row and second row contacts are categorized with inner and outer types alternately arranged with each other, and the inner type mounting pad of the first row contact is aligned with the outer types alternately arranged with each other, and the inner type mounting pad of an adjacent second row contact in a front to back direction, and the outer type mounting pad of the first row contact in the front to back direction, wherein the two first row and second row contacts having the two aligned inner type and outer type mounting pads thereof are spaced from each other with additional two neighboring contacts therebetween in the longitudinal direction.

2. The connector as described in claim 1, wherein said additional two neighboring contacts include one first row contact and one second row contact.

3. The connector as described in claim 1, wherein a tip of the mounting pad of each of said first row and second row contacts extending under a main body of the adjacent one of said first row and second row contacts of the same row along the direction said mounting pad extends.

4. The connector as described in claim 1, wherein a plurality of solder balls are attached to the corresponding mounting pads, respectively.

5. An electrical connector comprising:

an insulative housing defining a longitudinal direction thereof and having a plurality of first and second type contacts therein, said first and second type contacts being arranged staggered with each other along said longitudinal direction; and each of said first and second contacts including a main body and a horizontal mounting pad extending away from a plane defined by said main body; wherein the mounting pads of at least some of said first type contacts all extend in a first direction and those of at least some of said second type contacts all extend in a second direction opposite to said first direction so as to allow the mounting pads of said at least some of said first type contacts are essentially respectively aligned with those of said at least some of said second type contacts in a front-to-back direction perpendicular to said longitudinal direction, wherein the mounting pads of each type contacts of the first and second type contacts are further grouped with inner and outer types staged with each other, wherein the inner type mounting pads of the first type contacts are aligned in the front to back direction with the outer type mounting pads of the second type contacts, respectively, and the outer type mounting pads of the first type mounting pads of the first type contacts are aligned to the front to back direction with the inner type mounting pads of the second type contacts respectively.

6. The connector as described in claim 5, wherein the first type contacts and the second type contacts having the mutually aligned mounting pads in the front-to-back direction, are not the closest neighbors with each other but with at least one first type or second type contact therebetween.

7. The connector as described in claim 6, wherein said at least one first type or second type contact refers to one first type contact and one second type contact.

8. The connector as described in claim 5, wherein said first type contacts and said second type contacts are not aligned in a same row along the longitudinal direction.

9. The connector as described in claim 5, wherein a plurality of solder balls are attached to the corresponding mounting pads, respectively.

* * * * *